United States Patent
Anderson et al.

(10) Patent No.: US 7,605,435 B2
(45) Date of Patent: Oct. 20, 2009

(54) BI-DIRECTIONAL MOSFET POWER SWITCH WITH SINGLE METAL LAYER

(75) Inventors: Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 0 days.

(21) Appl. No.: 11/773,187

(22) Filed: Jul. 3, 2007

(65) Prior Publication Data

US 2008/0121995 A1 May 29, 2008

Related U.S. Application Data

(60) Provisional application No. 60/806,818, filed on Jul. 10, 2006.

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/06 | (2006.01) |
| H01L 47/02 | (2006.01) |
| H01L 29/417 | (2006.01) |
| H01L 29/74 | (2006.01) |
| H01L 31/111 | (2006.01) |
| H01L 29/423 | (2006.01) |

(52) U.S. Cl. .......................... 257/401; 257/7; 257/121; 257/124; 257/341; 257/342; 257/393; 257/E27.001; 257/E27.07; 257/E27.108; 257/E27.121; 257/E29.001; 257/E29.325

(58) Field of Classification Search ...................... 257/7, 257/121, 124, 341–342, 393, 401, E27.07, 257/E27.108, E27.121, E27.001, E29.001, 257/E29.325

See application file for complete search history.

(56) References Cited

U.S. PATENT DOCUMENTS

| | | | | | |
|---|---|---|---|---|---|
| 5,389,813 | A | * | 2/1995 | Schwob | 257/469 |
| 5,717,240 | A | * | 2/1998 | Kuriyama et al. | 257/370 |
| 5,784,327 | A | * | 7/1998 | Hazani | 365/189.03 |
| 5,963,407 | A | * | 10/1999 | Fragapane et al. | 361/42 |
| 6,037,226 | A | * | 3/2000 | Ra | 438/263 |

(Continued)

FOREIGN PATENT DOCUMENTS

WO 2004070791 A2 8/2004

*Primary Examiner*—Ida M Soward
(74) *Attorney, Agent, or Firm*—Robert D. Atkins (57) ABSTRACT

A bi-directional power switch is formed as a monolithic semiconductor device. The power switch has two MOSFETs formed with separate source contacts to the external package and a common drain. The MOSFETs have first and second channel regions formed over a well region above a substrate. A first source is formed in the first channel. A first metal makes electrical contact to the first source. A first gate region is formed over the first channel. A second source region is formed in the second channel. A second metal makes electrical contact to the second source. A second gate region is formed over the second channel. A common drain region is disposed between the first and second gate regions. A local oxidation on silicon region and field implant are formed over the common drain region. The metal contacts are formed in the same plane as a single metal layer.

4 Claims, 6 Drawing Sheets

U.S. PATENT DOCUMENTS

| | | | |
|---|---|---|---|
| 6,268,627 B1 * | 7/2001 | Ishigaki et al. | 257/336 |
| 6,313,018 B1 * | 11/2001 | Wang et al. | 438/584 |
| 6,384,486 B2 * | 5/2002 | Zuniga et al. | 257/781 |
| 6,545,310 B2 * | 4/2003 | Li et al. | 257/314 |
| 6,642,586 B2 * | 11/2003 | Takahashi | 257/390 |
| 6,653,709 B2 * | 11/2003 | Wu et al. | 257/499 |
| 6,690,555 B1 * | 2/2004 | Pasqualini | 361/56 |
| 7,029,932 B1 * | 4/2006 | Hiser et al. | 438/14 |
| 7,189,608 B2 * | 3/2007 | Venkatraman et al. | 438/218 |
| 7,271,436 B2 * | 9/2007 | Lee et al. | 257/314 |
| 2002/0167036 A1 * | 11/2002 | Hwang et al. | 257/296 |
| 2003/0016553 A1 | 1/2003 | Subramanian et al. | |
| 2006/0022294 A1 * | 2/2006 | Petzold et al. | 257/491 |
| 2006/0043487 A1 * | 3/2006 | Pauletti et al. | 257/355 |
| 2006/0118811 A1 * | 6/2006 | Zheng et al. | 257/107 |

* cited by examiner

BI-DIRECTIONAL MOSFET POWER SWITCH WITH SINGLE METAL LAYER

CLAIM TO DOMESTIC PRIORITY

The present non-provisional patent application claims priority to provisional application Ser. No. 60/806,818, entitled "Bi-directional MOSFET Power Switch with Single Metal Layer," and filed on Jul. 10, 2006.

FIELD OF THE INVENTION

The present invention relates in general to electronic circuits and semiconductor devices and, more particularly, to a bi-directional power switch implemented as two or more MOSFETs having local oxidation on silicon layer over a common drain and using single layer or multi-layer metal for the source contacts.

BACKGROUND OF THE INVENTION

MOSFETs (metal-oxide-semiconductor field-effect transistors) are commonly used in electronic circuits, such as communication systems and power supplies. Power MOSFETs are particularly useful when used as electric switches to enable and disable the conduction of relatively large currents. In some cases, the power MOSFET switch is made bi-directional, i.e., capable of conducting currents equally well in both directions (drain-source and source-drain) within the device. The power MOSFET bi-directional switch (BDS) is typically contained within a monolithic device for ease of integration and system design. Power MOSFET BDS are used in many applications, such as in battery-charging circuitry to permit controlling the charging and discharging of batteries.

The current flow for MOSFETs goes between conduction contacts, e.g., from the source to the drain via the substrate. When creating bi-directional switches, two vertical trench MOSFETS can be used and connected via a common drain. The $R_{DSON}$ (static drain-source on-resistance) should be minimized for power loss and heat dissipation.

A semiconductor device implementing a bi-directional MOSFET power switch is disclosed in International Application No. PCT/US2004/003051, entitled "Bi-Directional Power Switch." The semiconductor device uses two or more MOSFETs to form the bi-directional power switch. The source terminals of the MOSFETs form the external contacts of the power switch. The drains of the MOSFETs are commonly formed. A control circuit drives the gates of the MOSFETs to enable and disable the power switch. The bi-directional power switch uses a two-metal layer submicron complementary metal oxide semiconductor (CMOS) process. It is desirable to simplify the manufacturing process to achieve lower production costs.

Accordingly, there is a need to provide bi-directional power switches with efficient current flow and without the need for more costly packaging. There is also a need for bi-directional switches with improved on-resistance using low-cost manufacturing processes.

SUMMARY OF THE INVENTION

In one embodiment, the present invention is a monolithic semiconductor device comprising a substrate and a well region formed over the substrate. A first channel region is formed in the well region. A first source region is formed adjacent to the first channel region. A first metal layer is formed in electrical contact with the first source region. A first gate region is formed over the first channel region. A second channel region is formed in the well region. A second source region is formed adjacent to the second channel region. A second metal layer is formed in electrical contact with the second source region. A second gate region is formed over the second channel region. A common drain region is disposed between the first and second gate regions. A local oxidation on silicon region is formed over the common drain region.

In another embodiment, the present invention is a monolithic semiconductor device comprising a substrate and a well region formed over the substrate. A first channel region is formed in the well region. A first source region is formed adjacent to the first channel region. A first metal layer is formed in electrical contact with the first source region. A first gate region is formed over the first channel region. A second channel region is formed in the well region. A second source region is formed adjacent to the second channel region. A second metal layer is formed in electrical contact with the second source region. The first and second metal layers are formed in a first plane. A second gate region is formed over the second channel region. A common drain region is disposed between the first and second gate regions.

In another embodiment, the present invention is an integrated circuit comprising a semiconductor device including a substrate and a well region formed over the substrate. A first transistor has a first channel region formed in the well region, a first source region formed adjacent to the first channel region, a first metal layer in electrical contact with the first source region, and a first gate region formed over the first channel region. A second transistor has a second channel region formed in the well region, a second source region formed adjacent to the second channel region, a second metal layer in electrical contact with the second source region, and a second gate region formed over the second channel region. The first and second metal layers are formed in a first plane. A common drain region is disposed between the first and second gate regions of the first and second transistors. A control circuit has a first output coupled to the first gate region and a second output coupled to the second gate region.

In another embodiment, the present invention is a method of making a monolithic semiconductor device comprising the steps of forming a substrate, forming a well region over the substrate, forming a first channel region in the well region, forming a first source region adjacent to the first channel region, forming a first metal layer in electrical contact with the first source region, forming a first gate region over the first channel region, forming a second channel region in the well region, forming a second source region adjacent to the second channel region, forming a second metal layer in electrical contact with the second source region, wherein the first and second metal layers are formed in a first plane, forming a second gate region over the second channel region, and forming a common drain region between the first and second gate regions.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
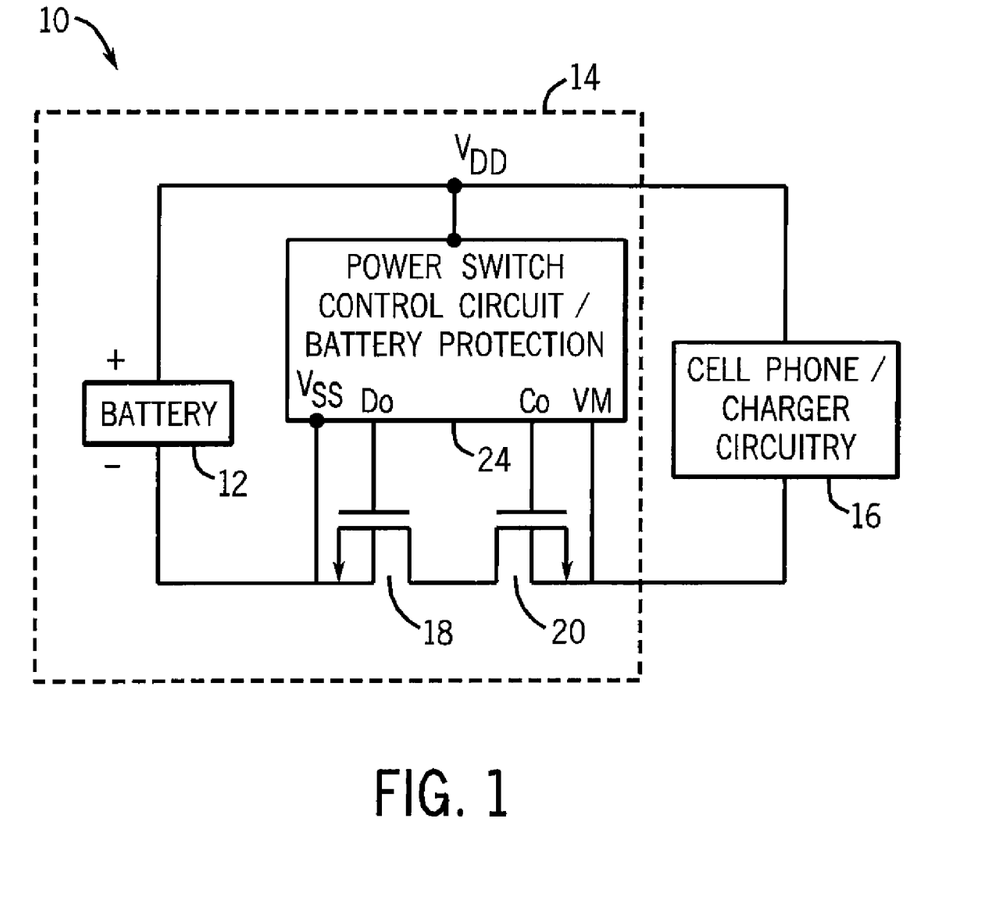
FIG. 1 illustrates a block diagram of a cell phone with bi-directional power switch.

Referring to FIG. 1, a simplified block diagram of a cellular phone 10 is shown having a Lithium ion battery 12. Battery 12, in combination with power switch control circuit/battery protection integrated circuit (IC) 24 and bi-directional metal oxide semiconductor field effect transistors (MOSFETS) 18 and 20 make up battery pack 14. The positive terminal of battery 12 is applied to power supply terminal $V_{DD}$ of power switch control circuit 24 as well as cell phone/charger circuitry 16. MOSFETs 18-20 are connected in the return path between cell phone/charger circuitry 16 and battery 12. Alternatively, MOSFETs 18-20 could be placed in the positive power supply path between battery 12 and cell phone/charger circuitry 16.

MOSFETs 18-20 are bi-directional in that each device is involved in either sourcing current from battery 12 in order to provide power to cell phone circuitry 16 or receiving current from charger circuitry 16 to recharge battery 12. Circuitry 16 may include RF signal processing components such as an RF amplifier, modulator, demodulator, oscillator, and power management. The RF signal processing section receives RF signals, downconverts and demodulates the signals to baseband signals. Cell phone/charger circuitry 16 may further include digital signal processing components such as a microprocessor, analog to digital converter, digital to analog converter, memory, and control logic. The digital signal processing section processes the baseband information so the user can hear and speak over the cell phone.

MOSFETs 18-20 operate as a power switch to either pass or block the current, in a bi-directional manner, for cell phone/charger circuitry 16. In one direction, if MOSFETs 18-20 are both conducting, i.e., the power switch is closed, the current from battery 12 energizes cell phone circuitry 16 to perform its function. If MOSFET 18 is non-conducting, i.e., the power switch is open, the current from battery 12 is blocked, and circuitry 16 does not operate. In the other direction, MOSFETs 18-20 can pass current from charger circuitry 16 to recharge battery 12 while providing battery protection. If MOSFET 20 is non-conducting, the battery no longer can be charged.

The power switch includes MOSFETs 18 and 20 and control circuit 24. The source of MOSFET 18 is connected to the negative terminal of battery 12. The source of MOSFET 20 is connected to the ground terminal of cell phone/charger circuitry 16. MOSFETs 18 and 20 have common drains. Control circuit 24 has separate leads DO and CO connected to the gates of MOSFETs 18 and 20 to turn the devices on and off. Control circuit 24 has further leads VSS and VM connected to the sources of MOSFETs 18 and 20 to monitor the respective voltage levels. The source voltages are used to enable and disable MOSFETs 18 and 20. Thus, control circuit 24 biases the gates of MOSFETs 18 and 20 to allow battery 12 to power cell phone circuitry 16, or to allow charger circuitry 16 to recharge battery 12.

FIGS. 2a-2g illustrate the formation of MOSFETs 18 and 20, i.e., the transistor area of the semiconductor die, using a local oxidation of silicon (LOCOS) process. FIGS. 3a-3g illustrate the formation of poly diodes between gate and source regions of the MOSFETS for ESD protection. The devices are formed using CMOS fabrication processes to reduce the cost of production. In particular, the MOSFETs are formed without sidewall spacers, no lightly doped drain (Ldd) implant, and no $V_{th}$ adjust implant. In one embodiment, multiple MOSFETs are formed using lateral or trench devices on a single monolithic chip and connected in parallel. While only n-channel MOSFETS are shown, p-channel devices can also be made using the present invention.

In the cross-sectional view, substrate 30 is made of n-type semiconductor material and provides structural support. The following regions and layers are formed on substrate 30 using semiconductor manufacturing processes understood by those skilled in the art. The manufacturing processes include layering, patterning, doping, and heat treatment. In the layering process, materials are grown or deposited on the substrate by techniques involving thermal oxidation, nitridation, chemical vapor deposition, evaporation, and sputtering. Patterning involves use of photolithography to mask areas of the surface and etch away undesired material. The doping process injects concentrations of dopant material by thermal diffusion or ion implantation.

Figure 2A:
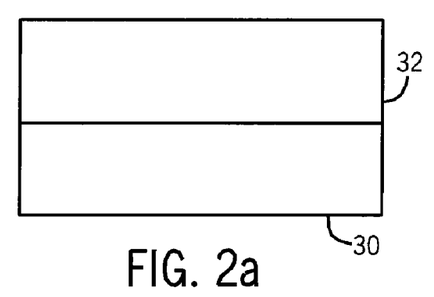
FIGS. 2a-2g illustrate the formation of MOSFETs with LOCOS region above a common drain.

Using the above semiconductor manufacturing processes, FIG. 2a illustrates the beginning layers for the MOSFETs 18 and 20. The MOSFETs are designed to be 20-30 volt devices operating as a bi-directional power switch. Substrate 30 is made with n-type semiconductor material having crystalline orientation <100> and resistivity of about 5-10 ohm-cm. An n-well 32 is formed over substrate 30 and implanted with blanket phosphorus (n-type semiconductor material) at about 125 KeV at 1200° C. for 3 hours to drive the implant to about 2-3 μm junction depth.

Figure 3A:
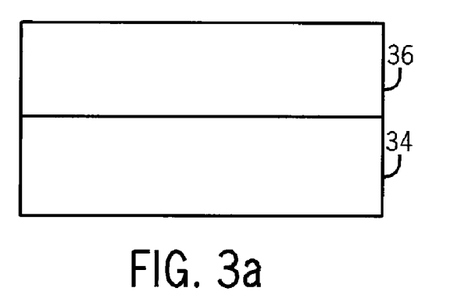
FIGS. 3a-3g illustrate the formation of an ESD poly diode.

FIG. 3a illustrates the beginning layers for an electrostatic device (ESD) poly diode area of the semiconductor die. Substrate 34 is made with n-type semiconductor material having crystalline orientation <100> and resistivity of about 5-10 ohm-cm. An n-well 36 is formed over substrate 34 and implanted with blanket phosphorus (n-type semiconductor material) at about 125 KeV to drive the implant to about 2-3 μm junction depth.

Figure 2B:
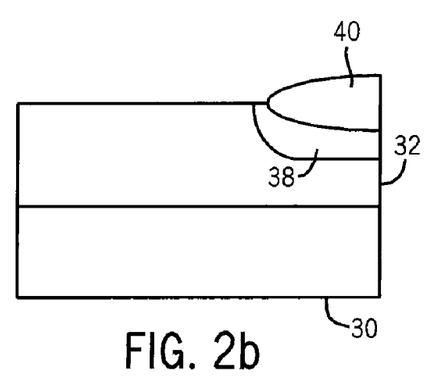

In FIG. 2b, field implant 38 and LOCOS area 40 are formed in n-well 32 for the transistor area of the semiconductor die using 1400 angstroms (Å) nitride deposition process at 1000° C. for 95 minutes. Using a first mask step, LOCOS 40 is formed by photolithography and etched for alignment. Arsenide (As) is the implant species for field implant layer 38.

Figure 3B:
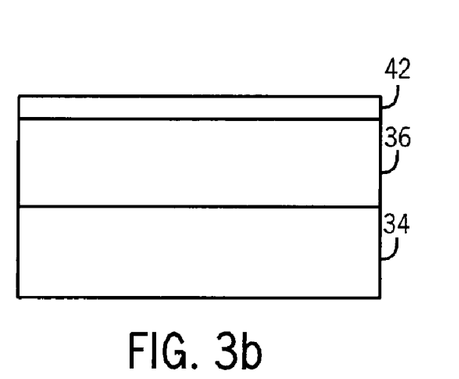

In FIG. 3b, an oxidation layer 42 is formed over n-well 36 in the ESD poly diode area of the semiconductor die. The field oxidation layer has a thickness ($T_{ox}$) of about 4000 Å.

Figure 2C:
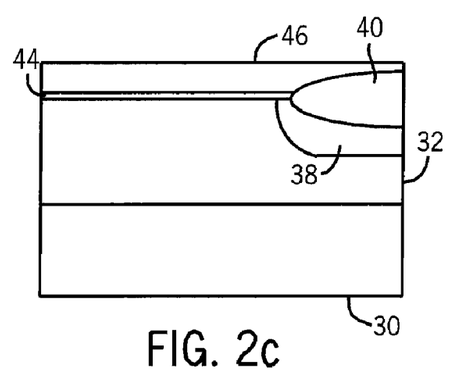

FIG. 2c illustrates a gate oxidation and polysilicon deposition step. Gate oxide layer 44 is formed over n-well 32. Polysilicon gate region 46 is formed over gate oxide 44 and LOCOS 40. The poly deposition goes to about 3600 Å, undoped with no polycide. The polysilicon gate 46 is exposed with a blanket p+ implant, e.g., Boron, as a $V_{th}$ adjustment implant. With the Boron implanted under 30 KeV to about 175 Å in poly gate 46, the threshold voltage can be adjusted $V_{gsmax}$+/−12 volts.

Figure 3C:
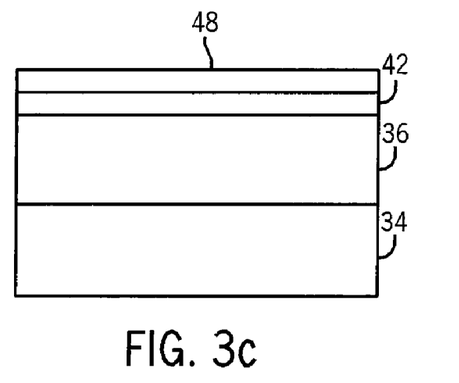

In FIG. 3c, a polysilicon layer 48 is also formed over oxidation layer 42 in the ESD poly diode area of the semiconductor die. The polysilicon layer 48 is exposed to a blanket p-type implant, e.g., Boron, under 30 KeV to about 175 Å. The implant dose is chosen to set the poly diode breakdown voltage.

Figure 2D:
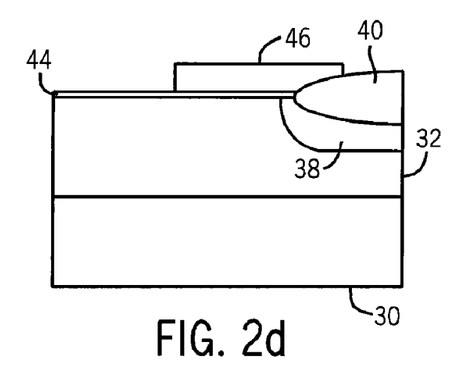
Figure 3D:
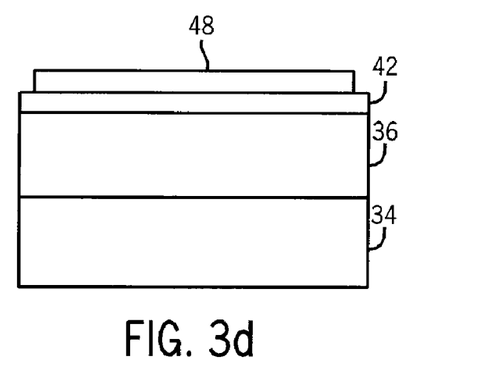
Figure 3E:
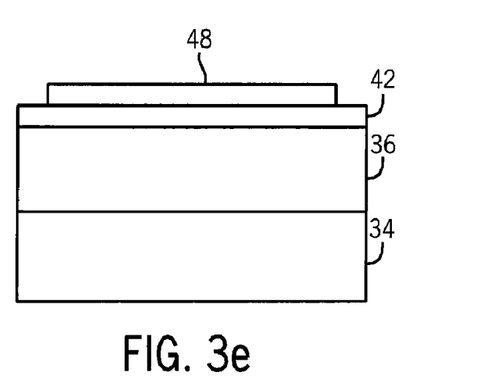

In FIGS. 2d and 3d, the polysilicon gate 46 and polysilicon layer 48 are patterned under a photolithography and etch process using a second mask step. The poly gate 46 is aligned to LOCOS 40.

Figure 2E:
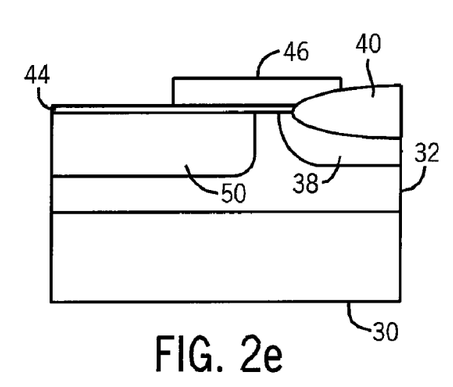

FIG. 2e shows the formation of p-channel region 50 in n-well 32. The p-channel region 50 is formed using a third mask step. A p-type dopant such as Boron is implanted in p-channel 50 under 40 KeV and driven in at 1000° C. for 3 hours. No change occurs to ESD poly diode area in FIG. 3e.

Figure 2F:
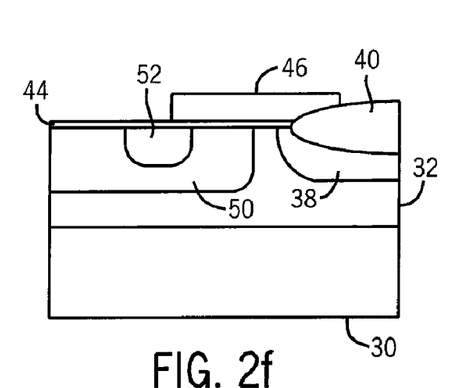
Figure 3F:
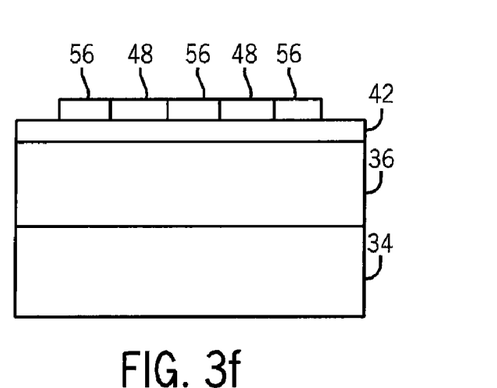
Figure 3G:
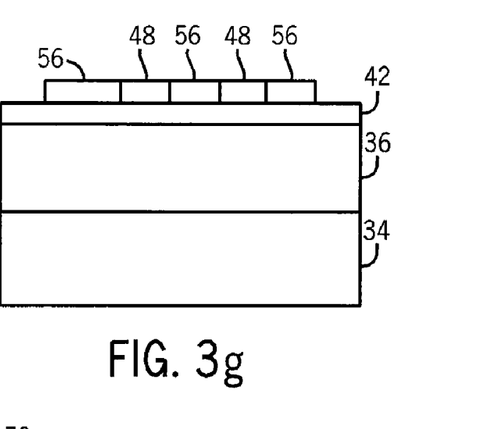

In FIG. 2f, n+ region 52 is formed adjacent to p-channel region 50 using a fourth mask step. The surface of the MOSFET is exposed with an arsenide implant at 50 KeV and then phosphorus implant at 50 KeV. In FIGS. 3f-3g, the same implant is performed to the surface of the ESD poly side forming the N+ regions 56 interspaced between p regions 48 in the ESD poly diode of the poly diode.

Figure 2G:
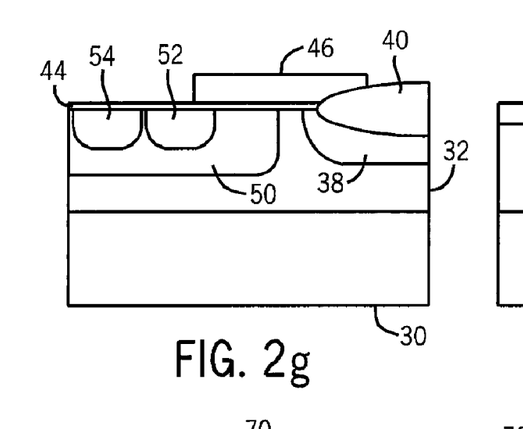

In FIG. 2g, p+ region 54 is formed adjacent to p-channel region 50 using a fifth mask step. The p+ region 54 in the MOSFET is exposed to Boron Fluorine (BF2) implant at 50 KeV. The p+ region 54 is the body contact to the source of the MOSFET.

Figure 4:
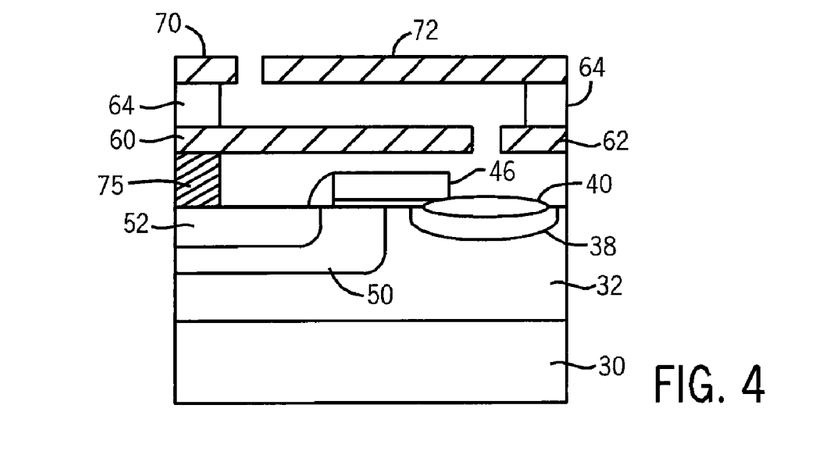
FIG. 4 illustrates one MOSFET with LOCOS region over the drain and first and second metal layers.

FIG. 4 illustrates an embodiment of the present invention with multi-layer metal contacts for the source terminals of the MOSFET. Notice that the multi-layer metal embodiment of FIG. 4 has LOCOS region 40 as described above. An Inter Layer Dielectric (ILD) layer of approximate thickness of 1 μm is formed. Contact region 75 is formed with the sixth mask step. First metal layers 60 and 62 are deposited and etched in a seventh mask step. Metal layers 60 and 62 are formed with titanium (Ti)/aluminum (Al)/Ti/titanium nitride (TiN) with depths of 100 Å, 10000 Å, 1000 Å, and 800 Å, respectively. An Inter Metal Dielectric (IMD) is formed of approximate thickness of 1 μm. Via region 64 is formed in an eighth mask step. Second metal layers 70 and 72 are deposited and etched in a ninth mask step. Metal layers 70 and 72 are formed with Ti/Al/Ti/TiN with depths of 100 Å, 10000 Å, 1000 Å, and 800 Å, respectively. The surface of the MOSFET is then passivated, as seen by regions 74 in FIG. 5.

Metal layers 60 and 62 are formed in the same plane. Metal layers 70 and 72 are formed in the same plane, although in a different plane than metal layers 60 and 62. Metal layer 60 may be electrically isolated from (as shown in FIG. 4) or electrically connected to metal layer 70. Likewise, metal layer 62 may be electrically isolated from or electrically connected to metal layer 72.

Figure 5:
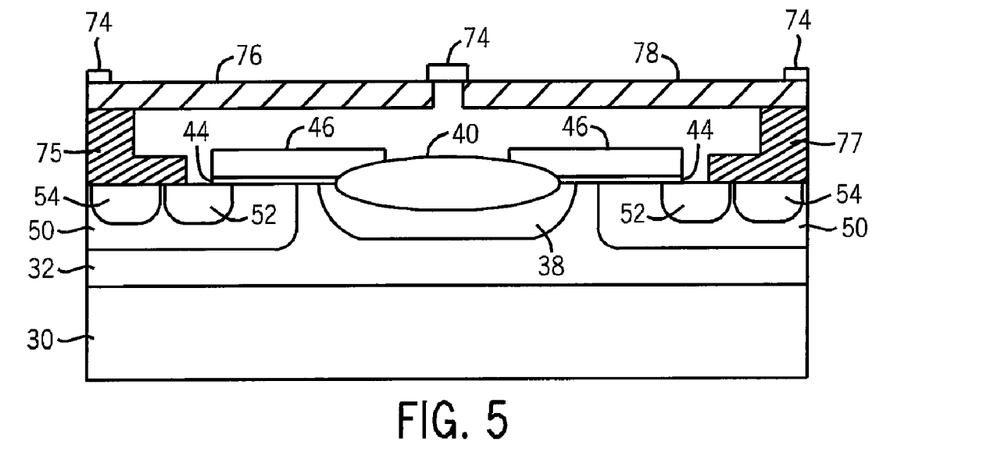
FIG. 5 illustrates first and second MOSFETs with the LOCOS region over the common drain.

While FIG. 4 illustrates MOSFET 18, it is understood that MOSFET 20 could be formed using the process steps described above. Toward that end, FIG. 5 illustrates MOSFETs 18 and 20 formed in the semiconductor die. Like regions for MOSFET 20 are assigned the same reference numbers used for MOSFET 18.

FIG. 5 illustrates a single-layer metal embodiment for the MOSFETs with LOCOS region 40. The single metal layer for the source contacts of MOSFETs 18-20 is formed as metal conductors 76 and 78 in the same plane of the semiconductor die. The metal is deposited and etched using a masking step. The metal is Ti/Al/Ti/TiN with thickness of 100 Å, 10000 Å, 100 Å, and 800 Å, respectively. Metal conductor 76 makes electrical contact with source regions 52 and 54 of transistor 18 through metal via 75. Metal conductor 78 makes electrical contact with source regions 52 and 54 of transistor 20 through metal via 77. Metal conductor 76 for the source of MOSFET 18 connects to battery 12; metal conductor 78 for the source of MOSFET 20 connects to cell phone/charger circuitry 16. The single-layer metal reduces manufacturing steps and simplifies the design of the IC.

In another embodiment, MOSFETS 18 and 20 can use a shallow trench isolation (STI) in place of LOCOS 40. STI is a shallow trench etched into the surface silicon region and filled with oxide. STI offer an advantage in that the isolation region can be made narrow allowing the transistors to be spaced closer together.

Note the LOCOS region 40 extending from the drain edges of the polysilicon gate into the common drain region. The area under thick oxide 38 is the common drain region. The LOCOS region 40 reduces the electric field stress allowing higher blocking voltages to be achieved. For example, with a die size of 3.36 mm$^2$, the source-to-source breakdown voltage is about 34.8 to 38.7 volts with gate to source voltage ($V_{GS}$) equal to zero and source-to-source current flow ($I_{s2,s1}$) of 250 μA. The source-to-source resistance is 18.27 to 21.1 mΩ with $V_{GS}$=2.5 volts and $I_{s2,s1}$=5.5 A. The gate-to-source threshold voltage is between 0.934 and 0.988 volts with $V_{GS}$=$V_{DS}$ and $I_{s2,s1}$=250 μA.

The ESD protection diode described in FIG. 3a-3g is coupled between gate region 46 and source region 52 of MOSFET 18. A second ESD protection diode is coupled between gate region 46 and source region 52 of MOSFET 20.

Figure 6:
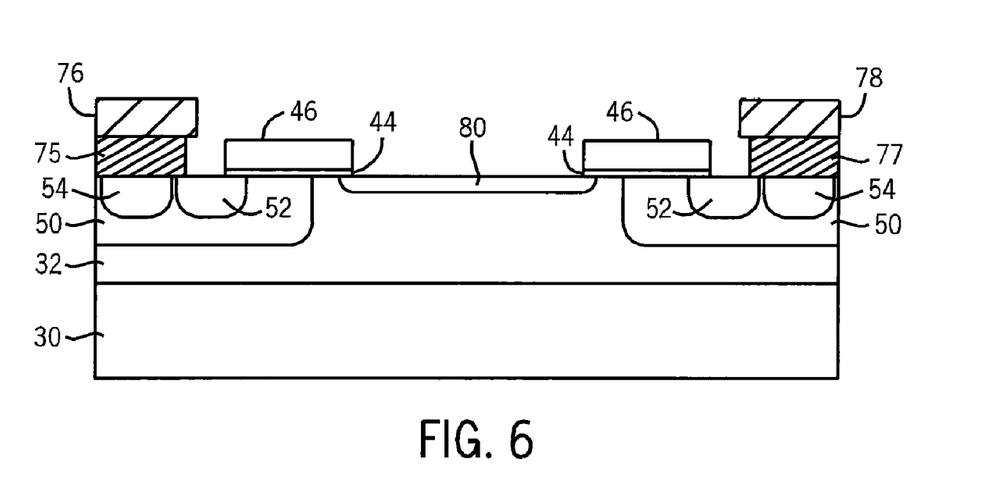
FIG. 6 illustrates first and second MOSFETs with common drain and single metal layer for source contacts.

FIG. 6 illustrates an alternate embodiment of the present invention having a single-layer metal structure for the source contacts of MOSFETs 18-20 but without a LOCOS region over common drain region 80. The common drain region 80 is lightly doped. The single metal layer for the source contacts of MOSFETs 18-20 is formed as conductors 76 and 78 in the same plane of the semiconductor die. Conductor 76 for the source of MOSFET 18 connects to battery 12; conductor 78 for the source of MOSFET 20 connects to cell phone/charger circuitry 16. The metal is deposited and etched using a masking step. The metal is Ti/Al/Ti/TiN with thickness of 100 Å, 10000 Å, 100 Å, and 800 Å, respectively. The surface of the MOSFETs is passivated.

Thus, as a feature of the present invention, the LOCOS region 40 can be formed in MOSFETs having single metal layer or multiple metals layers. Likewise, the MOSFETs can have a single metal layer with or without LOCOS region 40.

Figure 7:
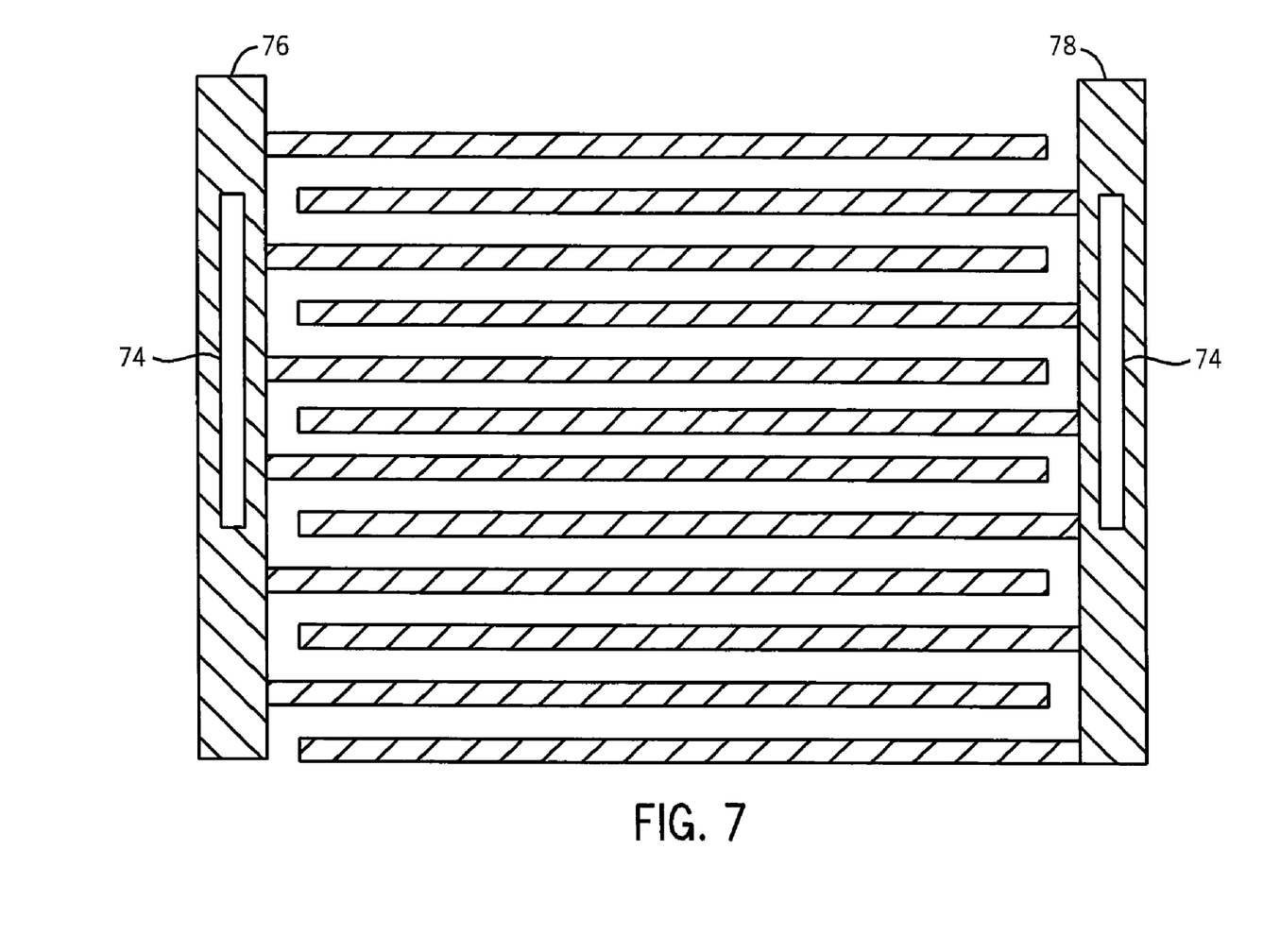
FIG. 7 illustrates a top view of the single metal layer for the source contacts.

FIG. 7 shows a top view of the single metal layer for source contacts 76 and 78. Metal layers 76 and 78 are interdigitated and use a pillar bump design. The single metal layer CMOS process, together with a copper pillar bump wafer level package, provide a lower cost product. The elimination of one metal layer reduces two masking layers from the wafer process.

Figure 8:
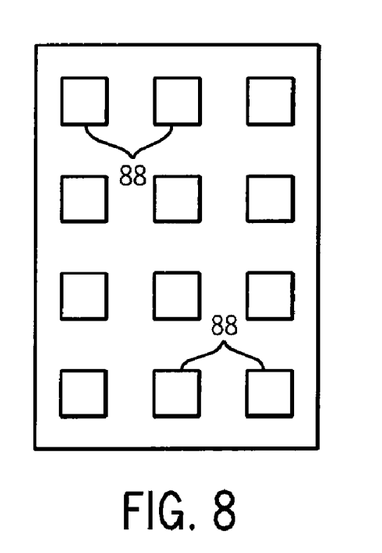
FIG. 8 illustrates external leads for power switch package.

FIG. 8 shows the package lead contacts for the bi-directional power switch. Contacts 88 are connected through the metal layers to the source, drain, and gate contacts of the MOSFETs by design choice. Contacts 88 may be copper pillar bumps or solder balls as formed in a wafer bump process. The bumps provide a good electrical contact for the structure of MOSFETs 18-20.

The present invention, including a LOCOS region over the common drain, and source contact single metal layer, is applicable to the semiconductor devices disclosed in International Application No. PCT/US2004/003051, entitled "Bi-Directional Power Switch," which is incorporated herein by reference.

While one or more embodiments of the present invention have been illustrated in detail, the skilled artisan will appreciate that modifications and adaptations to those embodiments may be made without departing from the scope of the present invention as set forth in the following claims.

What is claimed is:

1. A monolithic semiconductor device, comprising:
   a substrate;
   a well region formed over the substrate;
   a first channel region formed in the well region;
   a first source region formed adjacent to the first channel region;
   a first metal layer in electrical contact with the first source region;
   a first gate region formed over the first channel region;
   a second channel region formed in the well region;
   a second source region formed adjacent to the second channel region;
   a second metal layer in electrical contact with the second source region;
   a second gate region formed over the second channel region;
   a common drain region disposed between the first and second gate regions;
   a local oxidation on a silicon region formed over the common drain region;
   a first electrostatic protection diode coupled between the first gate region and first source region; and
   a second electrostatic protection diode coupled between second gate region and second source region.

2. A monolithic semiconductor device, comprising:
   a substrate;
   a well region formed over the substrate;
   a first channel region formed in the well region;
   a first source region formed adjacent to the first channel region;
   a first metal layer in electrical contact with the first source region;
   a first gate region formed over the first channel region;
   a second channel region formed in the well region;
   a second source region formed adjacent to the second channel region;
   a second metal layer in electrical contact with the second source region, wherein the first and second metal layers are formed in a first plane;
   a second gate region formed over the second channel region;
   a common drain region disposed between the first and second gate regions;
   a first electrostatic protection diode coupled between the first gate region and first source region; and
   a second electrostatic protection diode coupled between second gate region and second source region.

3. An integrated circuit, comprising:
   a semiconductor device including,
      (a) a substrate,
      (b) a well region formed over the substrate,
      (c) a first transistor having a first channel region formed in the well region, a first source region formed adjacent to the first channel region, a first metal layer in electrical contact with the first source region, and a first gate region formed over the first channel region,
      (d) a second transistor having a second channel region formed in the well region, a second source region formed adjacent to the second channel region, a second metal layer in electrical contact with the second source region, wherein the first and second metal layers are formed and interdigitated in the same plane, and a second gate region formed over the second channel region, and
      (e) a common drain region disposed between the first and second gate regions of the first and second transistors; and
   a control circuit having a first output coupled to the first gate region and a second output coupled to the second gate region.

4. The integrated circuit of claim 3, further including a local oxidation on a silicon region formed over the common drain region.

* * * * *